United States Patent [19]

Alaspa

[11] 3,895,239

[45] July 15, 1975

[54] MOS POWER-ON RESET CIRCUIT

[75] Inventor: Allan A. Alaspa, Tempe, Ariz.

[73] Assignee: Motorola, Inc., Chicago, Ill.

[22] Filed: Dec. 26, 1973

[21] Appl. No.: 428,531

[52] U.S. Cl. ................ 307/268; 307/251; 307/279; 307/296; 328/48

[51] Int. Cl....H03k 17/20; H03k 17/22; H03k 21/32

[58] Field of Search ........... 307/251, 268, 269, 279, 307/296; 328/48

[56] References Cited

OTHER PUBLICATIONS

Hanchett, "Turn–on Reset Pulse Circuits," RCA Technical Notes; TN No. 927; 3/28/1973; 4 pages.

*Primary Examiner*—Michael J. Lynch
*Assistant Examiner*—L. N. Anagnos
*Attorney, Agent, or Firm*—Vincent J. Rauner; Charles R. Hoffman

[57] ABSTRACT

An automatic power-on reset circuit adapted for use on complementary MOS integrated circuit semiconductor dies is provided. The circuit includes a voltage reference stage followed by an amplifier stage. A PN diode is coupled in series with a diode-connected MOSFET and a low current MOSFET device to provide a slight overdrive to the P-channel MOSFET of a CMOS inverter, which determines the initial output level thereof. As the voltage applied to the power supply conductor increases, the switching point of the amplifier-inverter stage varies until the output thereof assumes the opposite logic level. This transition of the output of the amplifier inverter stage is applied to wave shaping circuitry and an output circuit which reliably produces the desired reset signal.

10 Claims, 3 Drawing Figures

MOS POWER-ON RESET CIRCUIT

BACKGROUND OF THE INVENTION

The basic function of a power-on reset circuit is to provide a signal initiated by turning on the power source connected to the circuit, which signal is used to charge or discharge various nodes in the circuit to pre-establish conditions as circuit operation is initiated. Such power-on circuits are often needed in integrated circuits which include logic elements and flip-flops to preset the states of the flip-flops to a desired initial logic state or to establish initial voltages across capacitors, etc.

In the past it has been common practice to provide power-on reset circuits on MOS integrated circuits, which power-on reset circuits required external components, such as high value resistors and large capacitance capacitors. The use of external components was necessary because high value resistors and high value capacitors suitable for obtaining the relatively long time constants needed for such power-on reset circuits are not easily implementable in integrated circuits. The relatively long time constants are often needed in power-on reset circuits because the transient voltages of power supplies during power turn-on in many systems in which such MOS integrated circuits are likely to be utilized are quite variable. That is, some power turn-on transients may be very slow, as in systems in which heavy capacitive loading exists on the power supply conductors. However, in other systems the turn-on transients may be very fast or there may be high frequency noise spikes superimposed on a slower turn-on transient. The RC time constants of power-on reset circuits for many applications must be long enough to allow for a variety of such turn-on conditions. Until the present, a power-on reset circuit capable of being provided completely on a CMOS integrated circuit chip satisfying the above requirements has not been produced.

SUMMARY OF THE INVENTION

Briefly described, the invention is an automatic reset circuit coupled between first and second voltage conductors including a voltage reference circuit for providing a relatively constant voltage drop coupled between the first voltage conductor and an output node of the voltage reference circuit. The automatic reset circuit also includes an amplifying circuit coupled between the first and second voltage conductors. The amplifying circuit has an input coupled to the output node of the voltage reference circuit, and has an initial threshold voltage between the input node and the first voltage conductor less in magnitude than the voltage drop of the voltage reference circuit.

DESCRIPTION OF THE INVENTION

Figure 1:
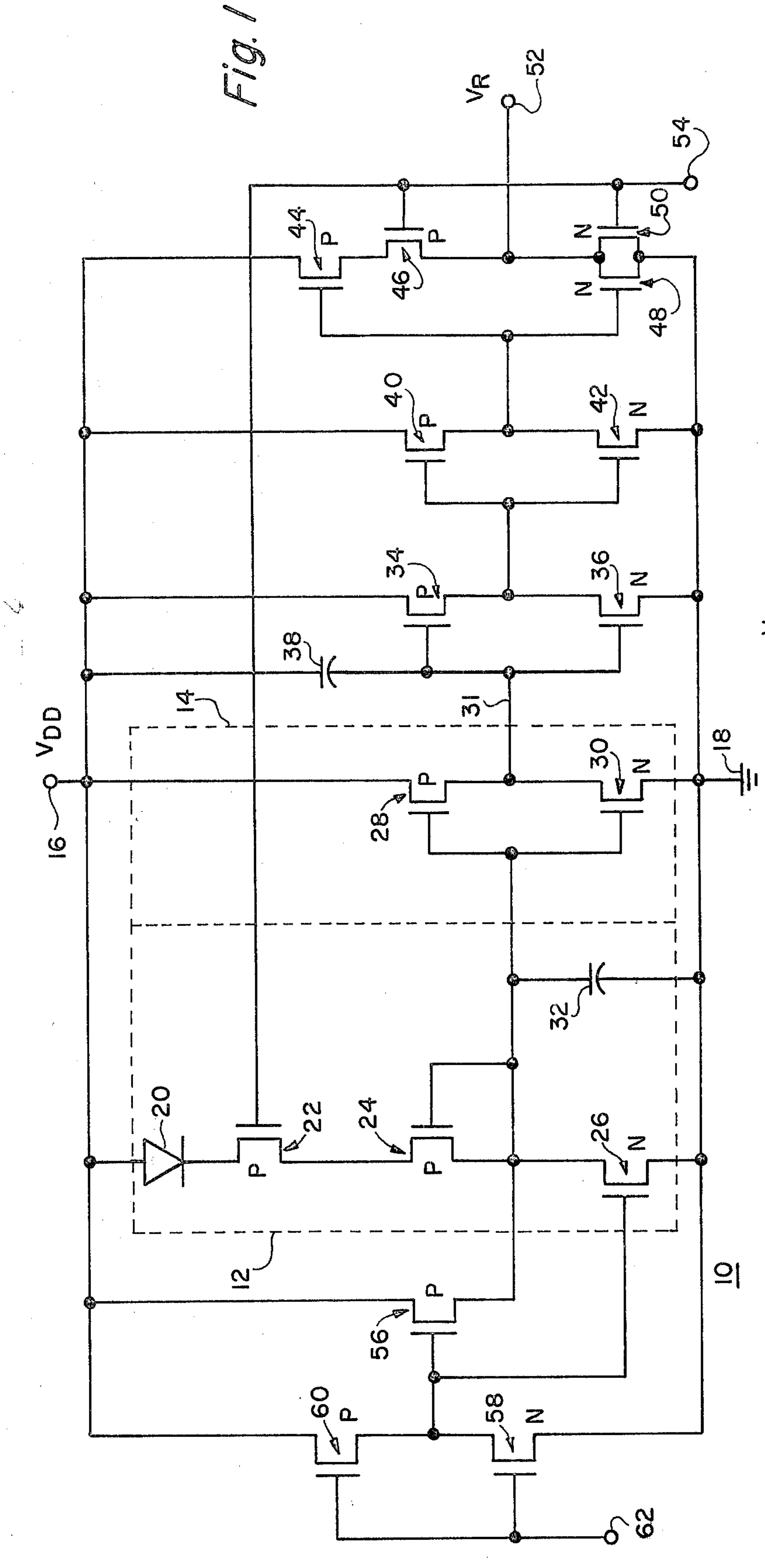
FIG. 1 is a circuit schematic diagram of a presently preferred embodiment of the invention.

FIG. 1 is a schematic diagram of automatic reset circuit 10. Automatic reset circuit 10 includes voltage reference circuit 12 and amplifying inverter circuit 14 which act in combination to provide the desired result. Automatic reset circuit 10 is coupled between $V_{DD}$ voltage conductor 16 and ground conductor 18. Voltage reference circuit 12 includes PN diode 20, P-channel MOSFETs 22, 24 and N-channel MOSFET 26 coupled in series between voltage conductors 16 and 18. The anode of diode 20 is coupled to $V_{DD}$ conductor 16 and its cathode is coupled to the source electrode of P-channel MOSFET 22, the drain electrode of which is coupled to the source electrode of MOSFET 24, the drain electrode of which is coupled to the drain electrode of MOSFET 26, the source electrode of which is coupled to ground conductor 18. The gate of MOSFET 22 is connected to manual reset conductor 54. The gate of MOSFET 24 is connected to its drain electrode. The output node of voltage reference circuit 12 is node 27. Capacitor 32 is coupled between node 27 and ground conductor 18 and is also coupled to the input of amplifying inverting circuit 14, which includes P-channel MOSFET 28 and N-channel MOSFET 30 coupled in series between $V_{DD}$ conductor 16 and ground conductor 18. The gate electrodes of MOSFETs 28 and 30 are coupled together to form the input which is connected to node 27.

The output of amplifier 14 is connected to conductor 31 which is coupled to additional circuitry including MOSFETs 34, 36, 40, 42, 44, 46, 48 and 50, which performs the function of shaping the signal applied to conductor 31 and producing the desired output reset signal $V_R$ at conductor 52. Conductor 31 is connected to the gates of P-channel MOSFET 34 and N-channel MOSFET 36 which are coupled in series between voltage conductors 16 and 18. Capacitor 38 is coupled between voltage conductor 16 and node 31. The output of the inverter formed by MOSFETs 34 and 36, formed at the connection of their respective drains, is connected to the gate electrodes of another MOSFET inverter formed by P-channel MOSFET 40 and N-channel MOSFET 42 which are coupled in series between voltage conductors 16 and 18. The drain electrodes of MOSFETs 40 and 42 are connected to the gate electrodes of the output stage of automatic reset circuit 10 which includes P-channel MOSFETs 44 and 46 and N-channel MOSFETs 48 and 50. The source of MOSFET 44 is connected to voltage conductor 16, and its drain is connected to the source of MOSFET 46, the drain of MOSFET 46 being connected to the drains of MOSFETs 48 and 50 and also to output conductor 52. The sources of MOSFETs 48 and 50 are connected to ground voltage conductor 18. The gates of MOSFETs 44 and 48 are coupled together to the output of the inverter formed by MOSFETs 40 and 42. The gate electrodes of MOSFETs 46 and 50 are connected to manual reset conductor 54. The reset disable circuitry of automatic reset circuit 10 includes P-channel MOSFETs 56 and 60 and N-channel MOSFET 58. MOSFETs 58 and 60 are coupled in series between voltage conductors 16 and 18, and have their gate electrodes connected to disable conductor 62. The drains of MOSFETs 58 and 60 are connected to the gates of MOSFETs 56 and 26. The source of MOSFET 56 is connected to voltage conductor 16 and the drain is connected to node 27. Typical values of the channel widths and channel lengths of the MOSFETs are indicated in Table I. Capacitor $C_1$ may be approximately 75 percent or more of the node capacitance.

TABLE I

| MOSFET | CHANNEL LENGTH (MILS) | CHANNEL WIDTH (MILS) |
|---|---|---|
| 22 | 0.4 | 1.0 |
| 24 | 0.4 | 5.0 |
| 26 | 2.8 | 0.2 |
| 28 | 0.6 | 0.4 |
| 30 | 0.6 | 0.6 |
| 34 | 0.4 | 0.4 |
| 36 | 0.4 | 0.4 |
| 40 | 0.4 | 0.4 |
| 42 | 0.4 | 0.4 |
| 44 | 0.4 | 3.0 |
| 46 | 0.4 | 3.0 |
| 48 | 0.4 | 3.0 |
| 50 | 0.4 | 3.0 |
| 56 | 0.4 | 1.0 |
| 58 | 0.4 | 0.4 |
| 60 | 0.4 | 0.4 |

The DC operation of the embodiment in FIG. 1 may be explained by assuming that $V_{DD}$ is initially zero volts and is gradually increased in value to perhaps 10 – 15 volts. It would also be helpful to assume that the threshold voltages of the P-channel and the N-channel MOSFETs are approximately 2 volts in magnitude. Explanation of the operation may also be facilitated by reference to the graph of $V_R$ vs $V_{DD}$ in FIG. 3.

Figure 3:
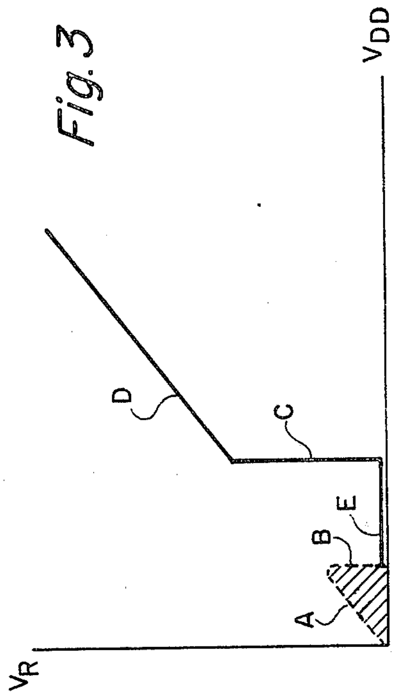
FIG. 3 is a transfer characteristic of the embodiment of FIG. 1.

The desired DC transfer characteristic is shown in the graph of FIG. 3. The general purpose of the circuit, for a slow $V_{DD}$ ramp voltage, is seen to be to provide an output reset signal $V_R$ which is essentially clamped to ground for at least part of the time until $V_{DD}$ reaches some value, at which time $V_R$ abruptly increases, along segment C in FIG. 3, to $V_{DD}$ volts and remains equal to $V_{DD}$ volts, along segment D, as $V_{DD}$ continues to increase. The dotted line segments A and B represent possible variations in the transfer characteristic which could result from parasitic leakage currents at low voltages at various nodes of the circuit.

Initially, assuming that reset input 54 and disable input 62 are at zero potential, all nodes in the circuit are at ground potential. As $V_{DD}$ increases, diode 20 becomes forward biased. When $V_{DD}$ exceeds the sum of the threshold voltage of MOSFET 22 and the forward drop of $V_D$ of diode 20, MOSFET 22 turns on, and the drain of MOSFET 22, which is connected to the source of MOSFET 24 increases to $V_{DD} - V_D$ volts. Diode-connected MOSFET 24 also turns on. (A diode-connected MOSFET is one having its gate connected to its drain. For a more thorough description of the operation and structure of MOSFETs, see *The Theory and the Applications of Field Effect Transistors*, by Cobbald, 1970, John Wiley and Sons, Inc.). The voltage at node 27 then follows $V_{DD}$ at $V_{DD} - V_D - V_{TP}$, where $V_{TP}$ is the threshold voltage of MOSFET 24. The current through the path including diode 20 and MOSFETs 22 and 24 is established by the resistance of MOSFET 26, whose gate voltage follows $V_{DD}$ once $V_{DD}$ exceeds $V_{TP}$ since MOSFET 60 is in the "on" condition. As indicated in Table I, MOSFET 26 is a very high resistance device (long channel length, narrow channel width) and the power dissipation is therefore low for voltage reference circuit 12.

At this point, the voltage between the gate and source of MOSFET 28 is seen to be $V_{TP} + V_D$ volts, which means that MOSFET 28 is "on" and is over-driven by $V_D$ volts, which is approximately 0.6 volts. Note that the over-drive of MOSFET 28 therefore remains constant as $V_{DD}$ increases. Hence, node 31 is at $V_{DD}$ volts. Thus, MOSFET 36 is "on," so that the output of complementary MOS inverter 34, 36 is at zero volts. This causes MOSFET 40 to be turned on, so that the output of complementary MOS inverter 40, 42 is at $V_{DD}$ volts, which causes MOSFET 48 to be "on," which in turn clamps $V_R$ to zero volts. This condition corresponds to segment E on FIG. 3.

As $V_{DD}$ increases further, the over-drive of MOSFET 28 remains equal to $V_D$ volts. However, the voltage at node 27 increases, turning on MOSFET 30 harder, and at some point, determined by the relative geometry ratios (which determine channel resistance) of MOSFETs 28 and 30, the output level of complementary MOS inverter 28, 30 switches from $V_{DD}$ volts to zero volts, as MOSFET 30 "overpowers" MOSFET 28. This results in a corresponding switching of inverter 34, 36 and inverter 40, 42, the output of the latter going from $V_{DD}$ volts to zero volts, thereby turning the MOSFET 48 off and MOSFET 44 on. MOSFET 46 will be in the "on" condition, since we have assumed that node 54 is at ground.

Clearly, if reset input 54 is increased to $V_{DD}$, MOSFET 50 will turn on, and MOSFET 46 will turn off, causing $V_R$ to be clamped to ground, regardless of conditions elsewhere in circuit 10. Also, MOSFET 22 is turned off under such conditions, eliminating the current and therefore the power dissipation in that path.

If disable input 62 is increased to $V_{DD}$ volts, MOSFET 56 is turned on, clamping node 27 to $V_{DD}$; MOSFET 26 is turned off, clearly disabling the voltage reference circuit 12 and eliminating the power dissipation therein. Thus, the automatic disable function provides an optional advantage of completely turning the circuit off and eliminating power dissipation. Then, the reset input 54 can be used to perform the reset function externally rather than using the automatic capability of the inventive circuit.

To improve the reliability of the AC operation of the circuit, it may be advantageous to make capacitor 32 large enough that when a step function is applied to the power supply terminal 16, node 27 only rises to a voltage which is safely below the switching point of the inverter 28, 30.

Capacitor 38 during transient turn-on conditions, boosts the voltage at node 31 closer to $V_{DD}$ volts, increasing the reliability of achieving a relatively high initial voltage on node 31.

It should be noted that diode 20 is manufactured by providing an N+ type diffusion within a P-type "tub" diffusion which is conventional in complementary MOS processing techniques. The tub needs to be biased to $+V_{DD}$ volts in order to avoid turning on a parasitic vertical NPN transistor which occurs between the N-type diffusion, the P-type tub which acts as a base electrode and the N-type substrate. For this reason, it may be important that diode 20 is placed so that it is connected to $V_{DD}$ conductor 16, rather than being connected in series at some other point with MOSFETs 22 and 24.

Figure 2:
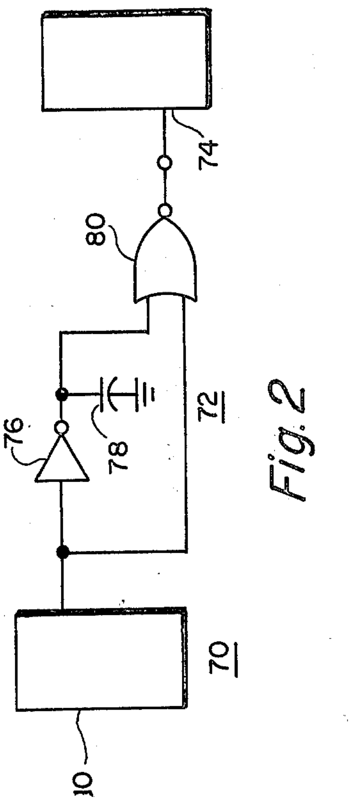
FIG. 2 is a diagram of another embodiment of the invention.

For certain circuit applications, especially for complementary MOS circuits which may include dynamic MOS circuitry on the same chip, it may be desirable to have a power-on reset circuit which provides a pulse of a particular duration rather than a DC level as provided by the circuit in FIG. 1. This may be accomplished by adding a one-shot circuit at the output of circuit 10 of FIG. 1. Such a circuit is shown in FIG. 2, where circuit 10 of FIG. 1 is represented by block 10, and a one-shot including inverter 76, capacitor 78, and NAND gate 80 constitute one-shot 72, which has its output connected to other circuitry 74 on the same chip. If the input of one-shot 72 goes high, the output of inverter 76 will also be high for the interval during which capacitor 78 is charged to the threshold voltage of NAND gate 80. A low signal will appear at the output of NAND gate 80 until capacitor 78 is charged past the threshold voltage. Then, the output of NAND gate 80 will return to $V_{DD}$ volts.

While the invention has been described in regard to a particular embodiment thereof, those skilled in the art will recognize that variations in placement and connection of components may be made within the scope of the invention to suit various requirements.

What is claimed is:

1. An MOS automatic reset circuit coupled between first and second voltage conductors for producing a reset signal when a voltage applied between said first and second voltage conductors exceeds a particular magnitude comprising:

a voltage reference circuit including a diode, a first MOSFET and a second MOSFET coupled in series between said first and second voltage conductors, said voltage reference circuit being for providing a reference voltage approximately equal in magnitude to the sum of the voltage drops across said diode and said second MOSFET:

a complementary MOS inverter circuit coupled between said first and second voltage conductors having an input coupled to the gate electrode and drain electrode of said second MOSFET.

2. The MOS automatic reset circuit as recited in claim 1 further including a wave shaping circuit coupled to an output of said complementary MOS inverter, said wave shaping circuit being for providing an output signal on an output node of said MOS automatic reset circuit coupled to said wave shaping circuit.

3. The MOS automatic reset circuit as recited in claim 2, said voltage reference circuit including a third MOSFET, said diode having its anode coupled to said first voltage conductor and its cathode coupled to the source electrode of said first MOSFET, said first MOSFET being P-channel and having its drain coupled to the source of said second MOSFET, said second MOSFET being P-channel and having its drain coupled to the input of said complementary MOS inverter, and to the drain of said third MOSFET, said third MOSFET being N-channel and having its source coupled to said second voltage conductor.

4. The MOS automatic reset circuit as recited in claim 3 wherein said wave shaping circuit includes second and third complementary MOS inverters cascaded with said first complementary MOS inverter and an output circuit including a fourth and fifth MOSFET coupled in series between said first and second voltage conductors, said fourth MOSFET being P-channel and said fifth MOSFET being N-channel, the source of said fourth MOSFET being coupled to said first voltage conductor and the drain of said fourth MOSFET being coupled to the drain of said fifth MOSFET, said fifth MOSFET having its source coupled to said second voltage conductor and its gate coupled to an output of said third complementary MOS inverter and also to the gate electrode of said fourth MOSFET, the drain of said fifth MOSFET being coupled to an output node of said automatic reset circuit.

5. The MOS automatic reset circuit as recited in claim 2 including a disable circuit for disabling said voltage reference circuit coupled between said first and second voltage conductors and a master reset circuit coupled to said output circuit and said voltage reference circuit.

6. The MOS automatic reset circuit as recited in claim 5 wherein said master reset circuit includes a sixth P-channel MOSFET coupled between the drain of said fifth MOSFET and the drain of said fourth MOSFET and having its gate electrode coupled to a master reset control conductor and to the gate electrode of said first MOSFET;

said disable circuit including an seventh P-channel MOSFET having its source coupled to said first voltage conductor and its drain coupled to the input of said first amplifier circuit, a fourth complementary MOS inverter coupled between said first and second voltage conductors having its input coupled to a reset disable conductor and its output coupled to the gate electrode of said third MOSFET and said seventh MOSFET.

7. The MOS automatic reset circuit as recited in claim 3 further including a capacitor coupled between an input of said second inverter and said first voltage conductor.

8. The MOS automatic reset circuit as recited in claim 3 further including a capacitor coupled between the input of said first inverter and said second voltage conductor.

9. The MOS automatic reset circuit as recited in claim 2 further including a one-shot circuit coupled to an output node of said MOS automatic reset circuit.

10. The MOS automatic reset circuit as recited in claim 1 on an integrated MOS semiconductor die providing a reset signal to additional circuitry on said semiconductor die.

* * * * *